United States Patent [19]

Van Antwerp

[11] Patent Number: 5,015,836

[45] Date of Patent: May 14, 1991

[54] SOURCE INTENSITY ADJUSTMENT APPARATUS FOR OPTICAL CHANNEL

[75] Inventor: Joel C. Van Antwerp, Bullard, Tex.

[73] Assignee: BEI Electronics, Inc., Carlsbad, Calif.

[21] Appl. No.: 475,330

[22] Filed: Feb. 5, 1990

[51] Int. Cl.$^5$ .............................................. G01J 1/32
[52] U.S. Cl. .................................. 250/205; 250/231.13
[58] Field of Search .............. 250/205, 231.13, 231.14, 250/231.15, 231.16, 231.17, 231.18

[56] References Cited

U.S. PATENT DOCUMENTS

| | | | |
|---|---|---|---|
| 4,620,094 | 10/1986 | Tani et al. | 250/205 |
| 4,649,267 | 3/1987 | Ray | 250/231.14 |
| 4,712,000 | 12/1987 | Yoshikawa et al. | 250/205 |

Primary Examiner—David C. Nelms
Attorney, Agent, or Firm—Limbach, Limbach & Sutton

[57] ABSTRACT

An improved design for an optical encoder with a compensation feedback signal for compensating for effects of time and temperature on the photoemission characteristics of the encoder's light source. By using a current mirror, the photodiodes which normally provide only the data signal now provide both the data signal and the compensation feedback signal, thereby eliminating the need for a separate, dedicated photodiode for the compensation feedback signal. This results in eliminating the necessity of matching the electrical operating characteristics of the data photodiodes to those of a compensation feedback photodiode. This further results in eliminating the large die area required for including a compensation feedback photodiode in an integrated circuit design.

19 Claims, 5 Drawing Sheets

SOURCE INTENSITY ADJUSTMENT APPARATUS FOR OPTICAL CHANNEL

BACKGROUND OF THE INVENTION

1. Field of the Invention

The present invention relates to optical encoding systems. In particular, the present invention relates to an optical encoder having a light source bias circuit which adjusts the electrical bias to the light source to compensate for aging and temperature effects thereon.

2. Description of the Prior Art

Optical encoders are often used to "observe" mechanical motion or activity and convert this "observation" into an electrical signal which may be used to represent or characterize such motion or activity. A simplified pictorial illustration of an optical encoder is shown in FIG. 1. A basic optical encoder 10 includes a light source 12, an optical path 14 along which light 16 from the light source 12 travels, and a light receiver 18. As described more fully below for FIG. 2, the light receiver 18 produces an electrical signal representative of how much light 28 it is receiving from the light source 12 via the optical path 14. Typically, a code disk 20 is positioned on a shaft 22 for rotation across the optical path 14. A radial ring of alternating opaque 24 and transparent 26 sections are formed near the outer edge of the code disk 20. The alternating opaque 24 and transparent 26 sections modulate the intensity of the light 16 traveling along the optical path 14, and therefore modulate the light 28 reaching the light receiver 18, as the code disk 20 rotates across the optical path 14. This causes the electrical signal produced by the light receiver 18 to change accordingly.

In some encoding systems this electrical signal may represent a series of binary bits. These are known as incremental encoders. In other encoding systems, known as absolute encoders, multibit binary "position" words formed from signals from multiple tracks of indicia are used to identify each resolvable position of the encoder. Still other encoding systems employ tracks of indicia which produce sinusoidal or other analog signals which are then converted into binary position words.

In all cases, but especially for analog encoders, it is important that the relative range of received light 28 and the absolute amounts of light within that range remain consistent. Any variations in such a relationship will introduce errors in the resulting position information. This means that the light source 12 must consistently put out substantially the same amount of light 16. This will ensure that any variations in the light 28 received at the light receiver 18 will be those produced by the indicia 24, 26 on the code disk 20 only, thereby making the electrical signal produced by the light receiver 18 truly representative of such indicia-imparted 24, 26 modulation.

Therefore, the encoding system 10 includes monitoring within the light receiver 18 to determine whether the light source 12 is consistently emitting the desired amount of light 16. This monitoring is done by measuring the light 28 received by the light receiver 18. A feedback signal based upon this measurement is provided to the light source 12 so as to effect any biasing adjustments which may be required to cause the light source output 16 to remain within the desired range.

Typically, to reliably monitor the light 28 received by the light receiver 18 an unobstructed light path, i.e., a light path free of any modulation, is desirable. Therefore, a radial transparent ring 27 is formed inboard from the aforementioned ring of opaque 24 and transparent 26 sections. This transparent ring 27 provides an unmodulated light path for reliably monitoring the light 28 received by the light receiver 18.

As explained more fully below for FIG. 2, in the past this monitoring has been accomplished by the use of multiple light sensors 44, 45, 46 within the light receiver 18. One or more light sensors 44, 45 are used as described above for sensing the modulation of the light 16 within the optical path 14 by the rotating ring of opaque 24 and transparent 26 sections and generating an electrical signal proportional thereto. Another light sensor 46 is used to monitor the total light 28 received from the light source 12 via the transparent ring 27 and provide the feedback signal for adjustment thereof. However, this arrangement requires a correlation or calibration between the light sensors 44, 45, 46 with respect to their respective sensitivities to light. Typically, the light source 12 is a light emitting diode ("LED") and the light sensors 44, 45, 46 are photosensitive diodes ("photodiodes"). A block diagram of a simple example of such a system 40 is illustrated in FIG. 2.

The basic components of a typical, simple optical encoding system 40 include: a LED 42; three photodiodes 44, 45, 46; an error amplifier 48; a resistor 50; two buffer amplifiers 52, 53; and an output amplifier 64. The LED 42, error amplifier 48 and resistor 50 make up the light source 12. The photodiodes 44, 45, 46, buffer amplifiers 52, 53 and output amplifier 64 make up the light receiver 18. (The optical path 14 may be any defined optical path between the light source 12 and light receiver 18.)

The "data" photodiodes 44, 45, buffer amplifiers 52, 53 and output amplifier 64 generate the data output signal which is a function of the amount of light 56, 57 incident on the photodiodes 44, 45. In turn, the amount of this incident light 56, 57 is a function of the amount of optical modulation within the optical path 14 induced by the rotating ring of opaque 24 and transparent 26 disk sections. The "monitor" photodiode 46 monitors the light 58 received from the LED 42 via the transparent ring 27 and generates the feedback signal 62 necessary to cause the total light output 54 from the LED 42 to remain consistent.

The LED 42 is driven into a light emitting state by the output of the error amplifier 48, receiving its supply current from the power supply $V_s$. The error amplifier 48 is a "transconductance" amplifier, providing an output current 63 dependent upon the relative magnitudes of its input voltages $V_{REF}$, $V_F$ (discussed below). According to means well known in the art, its output current 63 is current-limited (e.g., 35 milliamperes maximum) so as to prevent overdriving the LED 42 upon initial power up of the system 40.

The light 54 emitted by the LED 42 produces light 56, 57, 58 which is received by the photodiodes 44, 45, 46. The data photodiodes 44, 45 generate data signals 60, 61 in the form of electrical currents which are buffered by buffer amplifiers 52, 53 and compared by an output amplifier 64 to create the final data output signal. The buffer amplifiers 52, 53 are "transimpedance" amplifiers, providing output voltages 66, 67 dependent upon their respective input currents 60, 61, namely the currents flowing through their respective photodiodes 44, 45. The output amplifier 64 is a voltage comparator when a binary data output signal is desired, or a differential amplifier when an analog data output signal is desired. Voltage comparators and differential amplifiers are both well known in the art.

The monitor photodiode 46 generates a feedback signal 62 in the form of an electrical current which in turn generates a feedback voltage "$V_F$" across the resistor 50. This feedback voltage $V_F$ is compared to a reference voltage "$V_{REF}$" by the error amplifier 48. The difference between the feedback $V_F$ and reference $V_{REF}$ voltages determines whether or not the current drive 63 for the LED 42 is to be increased or decreased, thereby causing the LED 42 to emit more or less light 54.

As will be recognized by one of ordinary skill in the art, the two data photodiodes 44, 45 of FIGS. 1 and 2 constitute the simplest example of a photodiode array. By using a photodiode array rather than a single photodiode, phase information (e.g., information regarding the relative angular orientation of the disk 20) may be quantified by the data output signal. In a simple array as illustrated in FIG. 1 where the sizes of the opaque 24 and transparent 26 disk sections are substantially equal to the sizes of the data photodiodes 44, 45, the data photodiodes 44, 45 are physically situated so that when a transparent section 26 fully covers the first photodiode 44, an opaque section 24 fully covers the second photodiode 45, and vice versa. In this situation, the first photodiode 44 behind the transparent section 26 receives maximal light 56 and generates a maximal first data signal 60. The second photodiode 45 behind the opaque section 24 receives minimal light 57 and generates a minimal second data signal 61.

As will be appreciated by one of ordinary skill in the art, as the disk 20 rotates the orientations of the opaque 24 and transparent 26 sections shift, periodically resulting in the first 44 and second 45 photodiodes producing a minimal first data signal 60 and maximal second data signal 61, respectively, the inverse of those described above. As rotation of the disk 20 continues, the aforementioned changes in the data signals 60, 61 continue between minimal and maximal signal magnitudes, with relative increases in the first signal 60 being substantially equal to and corresponding with relative decreases in the second signal 61, and vice versa. Thus, between the extremes where only the first photodiode 44 and then the second 45 is illuminated, both photodiodes 44, 45 are partially illuminated. By proper processing of their respective data signals 60, 61 (the sum of which is substantially constant), the relative angular orientation of the disk 20 may be determined.

As will be appreciated by one of ordinary skill in the art, use of larger photodiode arrays (i.e., more than two data photodiodes 44, 45) and/or "phase plates" (i.e., smaller, more precisely dimensioned and positioned slits placed within the optical path 14 to more precisely define the optical path 14) will increase resolution of the phase information. Use of larger photodiode arrays and/or phase plates allows detection of smaller change increments in the relative angular orientation of the disk 20.

Since all of the photodiodes 44, 45, 46 are generating electrical signals based upon the amount of respective light 56, 57, 58 received by them, albeit for different purposes, it is important that their output signals 60, 61, 62 vary in a like manner, or at the very least, that any differences in the way they respond to the same light conditions be identified and compensated. This requires that the manufacturing processes by which these photodiodes 44, 45, 46 are manufactured produce photodiodes whose performance characteristics are virtually identical, or at least consistent with respect to their differences.

Furthermore, photodiodes are relatively large compared to other electronic devices. The main components of an optical encoder are typically integrated onto a single integrated circuit chip. Therefore, the need for a separate monitor photodiode 46 requires dedication of a relatively large circuit chip area (e.g., approximately 1,000 square mils per photodiode) within the integrated circuit chip.

Accordingly, it would be desirable to have an optical encoder design which eliminates the need for a separate monitor photodiode, thereby eliminating the need for photodiodes having matched or correlated characteristics. It would be further desirable to eliminate the need for a separate monitor photodiode so as to eliminate the need for the large surface area required therefor when integrating the encoder design onto a single integrated circuit chip.

SUMMARY OF THE INVENTION

The present invention is a circuit design for an optical encoder wherein a separate monitor photodiode is not required for generating the feedback signal necessary to control or compensate the light source bias. The photodiodes used to convert received light into an electrical signal representing data provide both the data signal and the feedback signal. The sum of the signals produced by the photodiodes is proportional to the total amount of light received from the light source and is a substantially constant electrical current, except for temperature- and/or age-induced variations. This electrical current remains substantially constant, even as the code disk rotates across the optical path.

This electrical current is duplicated by the use of a current mirror. The duplicate current is used as the feedback signal for controlling or compensating the light source bias. This eliminates the need for a separate, dedicated photodiode for feedback purposes, thereby eliminating the need for matched or correlated photodiode performance characteristics as well as the additional chip surface area for an additional photodiode on an integrated version of the design.

BRIEF DESCRIPTION OF THE DRAWINGS

Like numerals are used throughout the figures to designate like or corresponding elements.

DETAILED DESCRIPTION OF THE INVENTION

Figure 1:
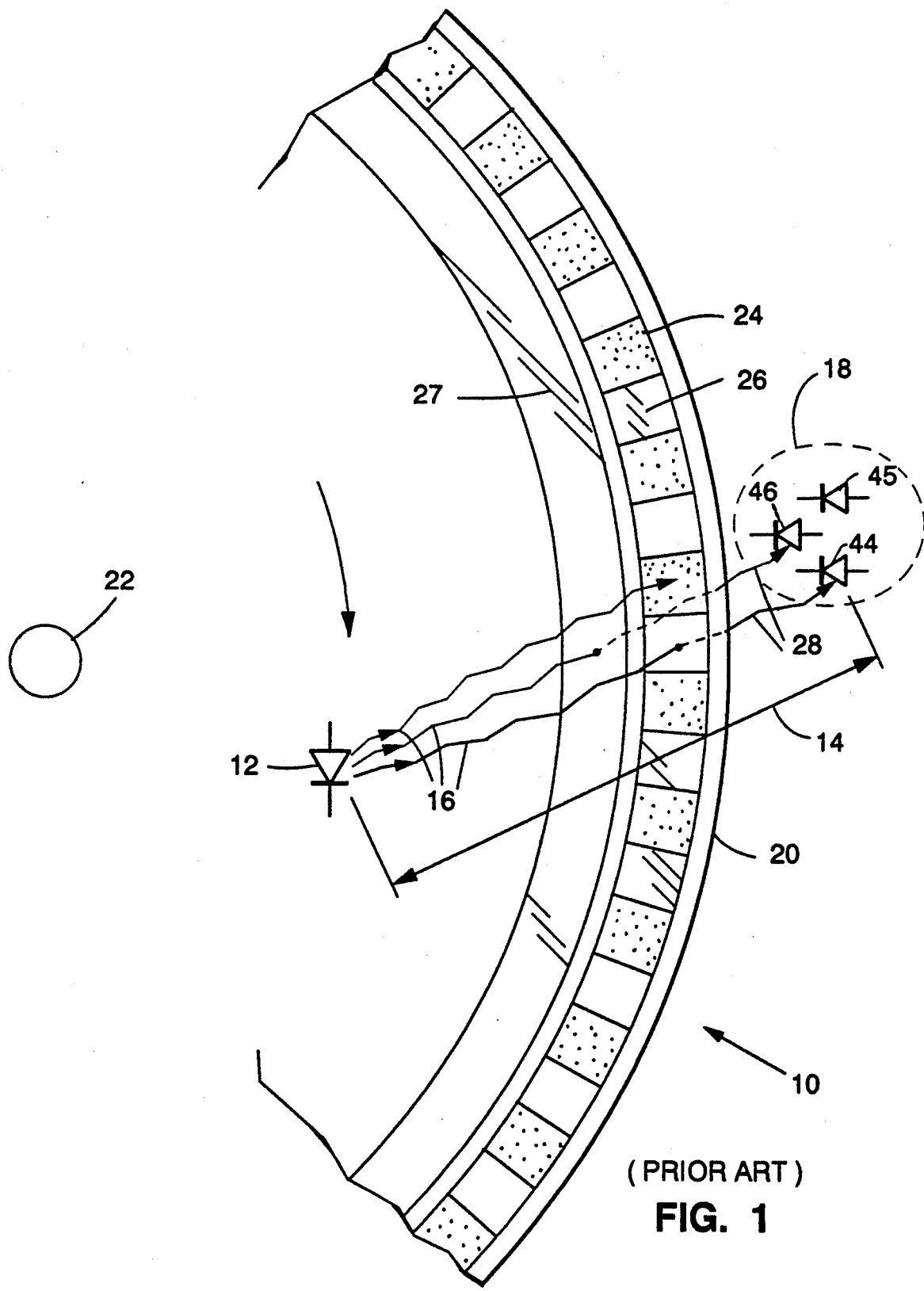
FIG. 1 illustrates in simplified pictorial form a basic prior art optical encoder wherein a code disk modulates the light within the optical path between a light source and light receiver.
Figure 2:
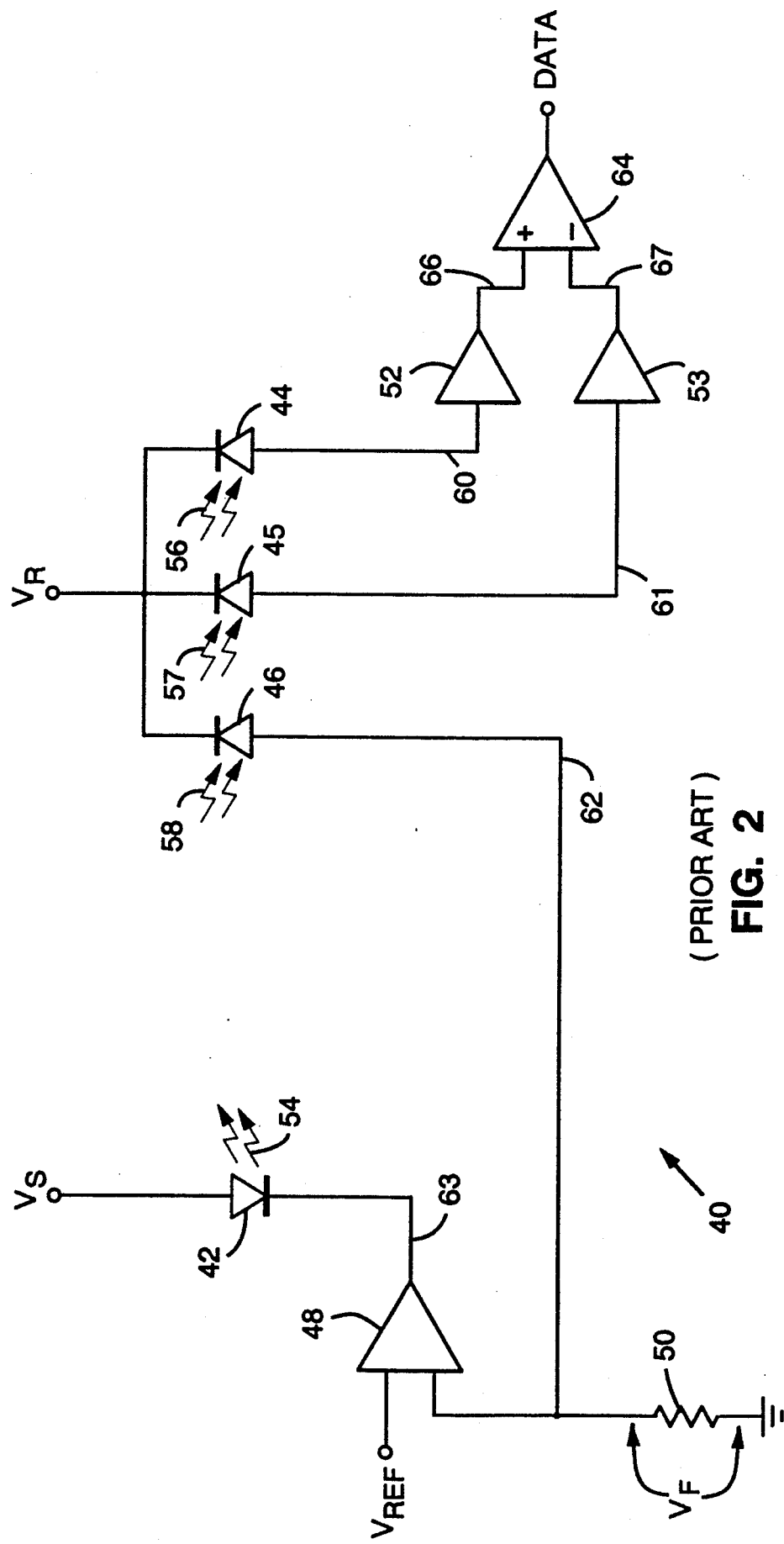
FIG. 2 illustrates in simplified, functional block diagram form the basic prior art optical encoding system of FIG. 1.
Figure 3:
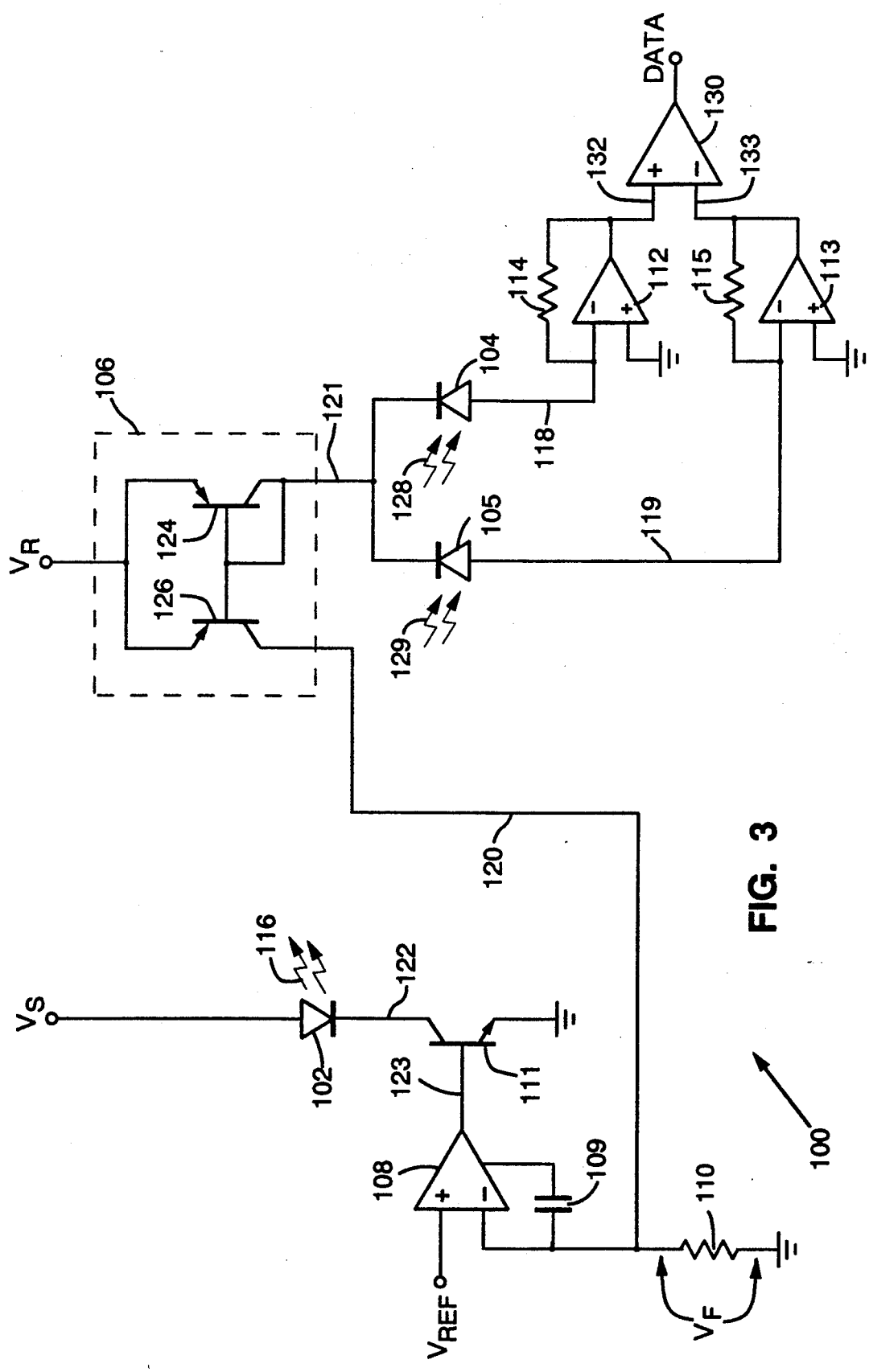
FIG. 3 illustrates in simplified, functional block diagram form a preferred embodiment of the optical encoding system of the present invention.

FIG. 3 illustrates in simplified, functional block diagram form the basic components of a preferred embodiment 100 of the optical encoding system of the present invention. These components include: a light emitting diode (LED) 102; two photodiodes 104 105; a current mirror 106; an error amplifier 108 with a compensation capacitor 109 and output transistor 111; a resistor 110; two buffer amplifiers 112, 113 with associated feedback resistors 114, 115; and an output amplifier 130.

The LED 102 emits a quantity of light 116 dependent upon its current drive 122 supplied via the output transistor 111 of the error amplifier 108. Light 128, 129 received by the photodiodes 104, 105 produces electrical currents through the photodiodes 104, 105 forming data signals 118, 119 which are buffered by the buffer amplifiers 112, 113. The current 121 constituting the sum of these electrical currents 118, 119 is duplicated by the current mirror 106, creating the electrical current which serves as the feedback signal 120.

It is to be noted that because the current sum 121 represents the sum of the currents 118, 119 through the photodiodes 104, 105, it has a magnitude which is substantially constant, even when the code disk 20 is not rotating (e.g., under dc conditions where no variations in the currents 118, 119 are induced). As discussed above, the photodiodes 104, 105 are disposed in a phased orientation and the variations in their respective currents 118, 119, caused by modulation from the code disk 20, are self-canceling when the currents 118, 119 are summed to form the current sum 121.

As shown in FIG. 3, the inverting inputs of the buffer amplifiers 112, 113 are connected to the anodes of the photodiodes 104, 105. The input of the current mirror 106, i.e., the collector of the input transistor 124, is connected to the cathodes of the photodiodes 104, 105. Thus, the currents 118, 119 through the photodiodes 104, 105 are the same currents flowing at the respective inverting inputs of the buffer amplifiers 112, 113 and sum together to form the input current 121 of the current mirror 106. This summing of the photodiode currents 118, 119 is pursuant to Kirchoff's Current Law, which is well known in the art. As explained below, this input current 121 is duplicated to form the output current 120 at the collector of the output transistor 126 of the current mirror 106.

The noninverting inputs of the buffer amplifiers 112, 113 are connected to the circuit ground reference. Feedback resistors 114, 115 connect between the inverting inputs and the outputs. Thus, the buffer amplifiers 114, 115 act as transimpedance amplifiers, converting their respective input currents 118, 119 into output voltages 132, 133. These output voltages 132, 133 serve as the inputs to the output amplifier 130. As discussed above, if the final data output signal is to be binary the output amplifier 130 is a voltage comparator. If the final data output signal is to be analog then the output amplifier 130 is a differential amplifier.

The feedback (current) signal 120 produces a feedback voltage $V_F$ across the resistor 110. This feedback voltage $V_F$ is compared to a selectable reference voltage $V_{REF}$ by the error amplifier 108 (e.g., differential amplifier), and the drive current 122 for the LED 102 is adjusted accordingly, if necessary. Thus, the light 128, 129 received by the photodiodes 104, 105 is used to generate both the data signals 118, 119 and the feedback signal 120.

Under normal biasing conditions, but with no "signal" applied (i.e., no received light 128, 129), the photodiodes 104, 105 typically conduct very small DC leakage currents 118, 119. To swamp out the effects of these leakage currents 118, 119 within the photodiodes 104, 105 and/or any input bias currents at the inputs of the buffer amplifiers 112, 113, the normal biasing conditions with a "signal" applied (i.e., reception of light 128, 129) are established so as to set the input current 121 of the current mirror 106 in the range of several microamperes.

The normal photodiode operational currents 118, 119 are established by properly selecting the value for the resistor 110 across which the feedback voltage $V_F$ is produced. By properly selecting the value for this resistor 110, the feedback current 120 may be selectably set at several micro-amperes. This in turn, due to the operation of the current mirror 106, will limit the input current 121 (and therefore the normal photodiode operational currents 118, 119) to a similar value.

Under normal operating conditions, the intensity variations of the light 128, 129 received by the photodiodes 104, 105 produce variations in their respective electrical conductivities. This produces variations in the amounts of current conducted by the photodiodes 104, 105, thereby causing the data (current) signals 118, 119 to appear. These signals 118, 119 are buffered by the buffer amplifiers 112, 113 before passing through the output amplifier 130 for use by other processing circuitry (not shown). However, with the passage of time and/or variations in temperature, the photoemission characteristics of the LED 102 change. Thus, the amount of light 116 emitted by the LED 102 and therefore the total light 128, 129 received by the photodiodes 104, 105 also changes.

The manner in which these changes are detected and compensated by the present invention will now be described in greater detail by way of example. If the total light 128, 129 received by the photodiodes 104, 105 becomes excessive, the photodiodes 104, 105 become excessively conductive. Since their currents 118, 119 sum to form the input current 121 to the current mirror 106, this causes an excessive amount of input current 121 to flow through the input transistor 124 of the current mirror 106. This excessive current 121 is duplicated, or "mirrored," by the output transistor 126 of the current mirror 106. The current mirror 106 is a conventional integrated circuit configuration which is well known in the art.

This duplicate current flows as the feedback signal 120 through the resistor 110, producing a feedback voltage $V_F$. This feedback voltage $V_F$ appears at the inverting input of the error amplifier 108. A reference voltage $V_{REF}$ appears at the noninverting input. A compensation capacitor 109 is connected between the inverting input and an internal compensation node (not shown) within the error amplifier 108. A typical value for such a compensation capacitor 109 is 0.47 microfarad. Such a compensation technique for such an amplifier 108 (e.g., operational amplifier) is well known in the art.

If the feedback voltage $V_F$ is greater than the reference voltage $V_{REF}$, the output voltage 123 of the error amplifier 108 decreases. This decrease in the output voltage 123 tends to decrease the forward bias of the base-emitter junction of the output transistor 111, causing its collector current 122 flowing through the LED 102 to decrease. This decrease in current 122 through the LED 102 causes its photoemissions 116 to decrease, thereby correcting its formerly excessive photoemissions 116.

Conversely, if the total light 128, 129 received by the photodiodes 104, 105 is too low, this causes a decrease in the currents 118, 119 flowing through the photodiodes 104, 105, thereby causing a decrease in the input current 121 flowing through the input transistor 124 of the current mirror 106. Therefore, the output current 120 through the output transistor 126 of the current mirror 106 also decreases. This causes the feedback voltage $V_F$ across the resistor 110 to decrease. This decreased feedback voltage $V_F$, appearing at the inverting input of the error amplifier 108, when compared to the fixed reference voltage $V_{REF}$ at the noninverting input, causes the output voltage 123 of the error amplifier 108 to increase. This tends to increase the forward bias across the base-emitter junction of the output transistor 111, thereby increasing its collector current 122. This in turn causes increased current 122 through the LED 102, with a concomitant increase in its formerly inadequate photoemissions 116.

As will be appreciated by one of ordinary skill in the art, one possible cause of inadequate light 128, 129 being received by the photodiodes 104, 105 is degradation (e.g., "soft" failure) or failure (e.g., "hard" failure) of the LED 102. Furthermore, the degradation rate of the LED 102 increases as its drive current 122 increases. Therefore, it may be desirable to limit the drive current 122 through the LED 102. Thus, it may be desirable to add some circuitry which provides some form of indication or warning that the LED 102 is degrading or failing.

As will be appreciated by one of ordinary skill in the art, a "'soft failure' alarm" feature may be incorporated into the circuit illustrated in FIG. 3. Such an alarm could include means for monitoring the drive current 122 through the LED 102. An alarm or some other signal could then be provided to indicate that the light 116 emitted by a degrading LED 102 is falling below some desired intensity, as reflected in a selectable threshold for the monitored LED drive current 122 (e.g., 50 milli-amperes). (Such an alarm would, of course, also indicate a "hard" failure.)

As discussed above, the feedback signal 120 generated by the current mirror 106 is to provide compensation for changes in the photoemission characteristics of the LED 102 caused by the relatively long term effects of time and temperature. It will be appreciated by one of ordinary skill in the art that changes in the electrical conductivities of the photodiodes 104, 105 caused by the normal variations in light 128, 129 intensity ("modulation") received by the photodiodes 104, 105 during normal operation of the optical encoding system 100 will be duplicated as corresponding variations in the photodiode currents 118, 119. These variations, if duplicated in the feedback current 120, would tend to counteract this modulation by producing opposing changes in the photoemission characteristics of the LED 102.

However, even though the photodiode currents 118, 119 sum to form the input current 121 of the current mirror 106, variations in those currents 118, 119 due to normal modulation by the code disk 20 mutually oppose one another by substantially equal amounts and therefore effectively cancel one another. Thus, the sum of those currents 118, 119, i.e., the input current 121 of the current mirror 106, remains substantially constant, thereby ensuring a substantially constant feedback current 120 free of any undesirable "modulation effects."

Nonetheless, as will be appreciated by one of ordinary skill in the art, even should any of these undesirable modulation effects be duplicated in the feedback current 120, they may be easily filtered out through the use of appropriate compensation techniques within the error amplifier 108. Such compensation techniques, well known in the art, include making the signal response characteristics of the error amplifier 108 insensitive to variations in the feedback signal 120 above a certain rate (e.g., frequency). This is accomplished by placing a dominant pole within the transfer function of the error amplifier 108. This is done by connecting to the appropriate internal circuit node (not shown) within the error amplifier 108 the compensation capacitor 109 in a feedback configuration to the inverting input. This causes the frequency response of the error amplifier 108 to "roll off" according to the capacitance value used. Thus, short term modulation effects are ignored while longer term light source degradation effects, such as those related to time and temperature, are compensated.

Figure 4:
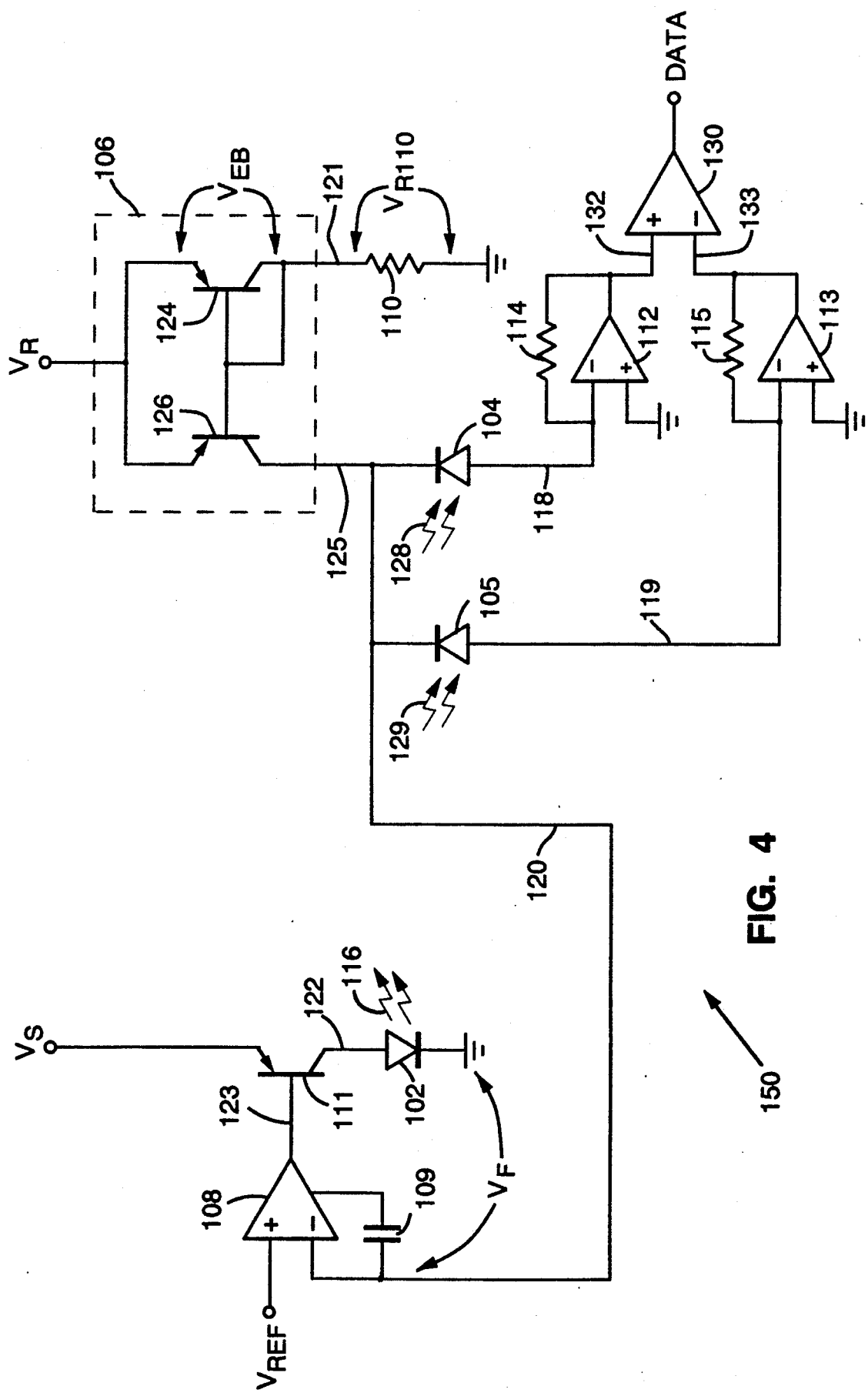
FIG. 4 illustrates in simplified, functional block diagram form an alternative preferred embodiment of the optical encoding system of the present invention.

FIG. 4 illustrates in simplified, functional block diagram form an alternative preferred embodiment 150 of the optical encoding system of the present invention. The basic components are unchanged from the configuration in FIG. 3, except for the output transistor 111 of the error amplifier 108 which is changed from an NPN to a PNP type. However, some of the circuit connections are different.

The photodiodes 104, 105 have exchanged circuit connections with the resistor 110. The cathodes of the photodiodes 104, 105 now connect to the current mirror 106 at the collector of its output transistor 126. The resistor 110 now connects between the current mirror 106 at the collector of its input transistor 124 and a fixed circuit reference potential (e.g., circuit ground reference).

In this circuit of FIG. 4 the current mirror 106 serves as a reference current source for the photodiodes 104, 105. Any difference between the output current 125 of the current mirror 106 and the sum of the currents 118, 119 through the photodiodes 104, 105 will cause the feedback voltage $V_F$ to either increase or decrease. This will, in turn, create an error voltage at the inverting input of the error amplifier 108, as explained in more detail below.

As explained above, in the circuit of FIG. 3 the photodiodes 104, 105 determine the input current 121 and therefore the output current 120 of the current mirror 106. However, in the circuit of FIG. 4 the resistor 110 at the input of the current mirror 106 establishes the input current 121 and therefore the output current 125 of the current mirror 106 flowing through the collector of the output transistor 126. According to Ohm's Law, the input current 121 is the current through the resistor 110 and is equal to the voltage $V_{R110}$ across the resistor 110 divided by the resistance value $R_{110}$ thereof (i.e., $I_{121} = I_{R110} = V_{R110}/R_{110}$). According to Kirchoff's Voltage Law, the voltage $V_{R110}$ across the resistor 110 is equal to the voltage $V_{EB}$ across the transistor 124 subtracted from the power supply voltage $V_R$ (i.e., $V_{R110} = V_R - V_{EB}$). The voltage $V_{EB}$ across the transistor 124 is equal to the voltage across the emitter-base junction of the transistor 124 since the base and collector are shorted together.

According to normal current mirror operation, this input current 121 of the current mirror 106 will be "mirrored" in the output current 125 flowing through the collector of the output transistor 126 (i.e., $I_{125} = I_{121} = I_{R110}$). Since the voltages $V_R$, $V_{EB}$ and the resistor 110 have substantially fixed values, the input current 121 through the collector of the input transistor 124 of the current mirror 106 is substantially fixed. Therefore, the output current 125 through the collector of the output transistor 126 is substantially fixed. Thus, the sum of the data (current) signals 118, 119 and feedback (current) signal 120 is substantially fixed and forms the output current 125 of the current mirror 106.

As seen in the above derivation of the voltage $V_{R110}$ across the resistor 110 ($V_{R110} = V_R - V_{EB}$), this voltage $V_{R110}$, and therefore the input current 121 of the current mirror 106 (i.e., as derived above: $I_{121} = I_{125} = I_{R110} = V_{R110}/R_{110}$), is directly dependent upon the power supply voltage $V_R$, voltage $V_{EB}$ across the transistor 124 and the value $R_{110}$ of the resistor 110. Thus, in the circuit of FIG. 4, temperature compensation should be provided for temperature-induced variations in the resistance value $R_{110}$ of the resistor 110 and the emitter-base voltage $V_{EB}$ of the transistor 124.

For example, it is well known in the art that the emitter-base voltage $V_{EB}$ of the transistor 124 will typically have a negative temperature coefficient of two millivolts per degree centigrade ($-2$ mV/°C). Therefore, the power source $V_R$ should be selected to have a voltage temperature coefficient of $-2$ mV/°C. The resistance value $R_{110}$ of the resistor 10 may also have some temperature dependence. If so, the power supply voltage $V_R$ may be designed to vary with temperature in a manner which will cause the output current 125 of the current mirror 106 to remain substantially constant over temperature.

As described above for FIG. 3, if the photodiodes 104, 105 receive more or less total light 128, 129 than desired, their conductivities become excessive or inadequate, respectively. This is also true for the photodiodes 104, 105 When connected as in FIG. 4. If the photodiodes 104, 105 receive too little light 128, 129, their conductivities decrease and their currents 118, 119 decrease. Hence, according to Kirchoff's Current Law, more of the output current 125 is available as feedback current 120. This increase in the feedback current 120 results in a corresponding increase in the feedback voltage $V_F$. The feedback voltage $V_F$ in the circuit configuration of FIG. 4 is represented by the voltage appearing at the inverting input of the error amplifier 108 (with respect to circuit ground reference). This voltage $V_F$ is produced by charging (or discharging) of the compensation capacitor 109 by the feedback current 120.

The error amplifier 108 operates as described above for FIG. 3. However, the relationship of the feedback voltage $V_F$ to the current 122 through the LED 102 is the inverse of the corresponding relationship in the circuit configuration of FIG. 3. Here in FIG. 4, if the feedback voltage $V_F$ increases, this corresponds to decreasing conductivities within the photodiodes 104, 105 caused by inadequate total received light 128, 129, as discussed above. This increase in feedback voltage $V_F$ at the inverting input of the error amplifier 108 causes its output voltage 123 to decrease, thereby increasing the forward bias on the emitter-base junction of its output transistor 111. This in turn causes its collector current 122 to increase, thereby increasing the current drive to the LED 102, with a concomitant increase in its photoemissions 116. The converse of these voltage-current relationships results when the feedback voltage $V_F$ decreases.

The buffer amplifiers 112, 113 and output amplifier 130 operate as described above for FIG. 3. Also as discussed above, the output amplifier 130 may selectively be a voltage comparator or differential amplifier.

Figure 5:
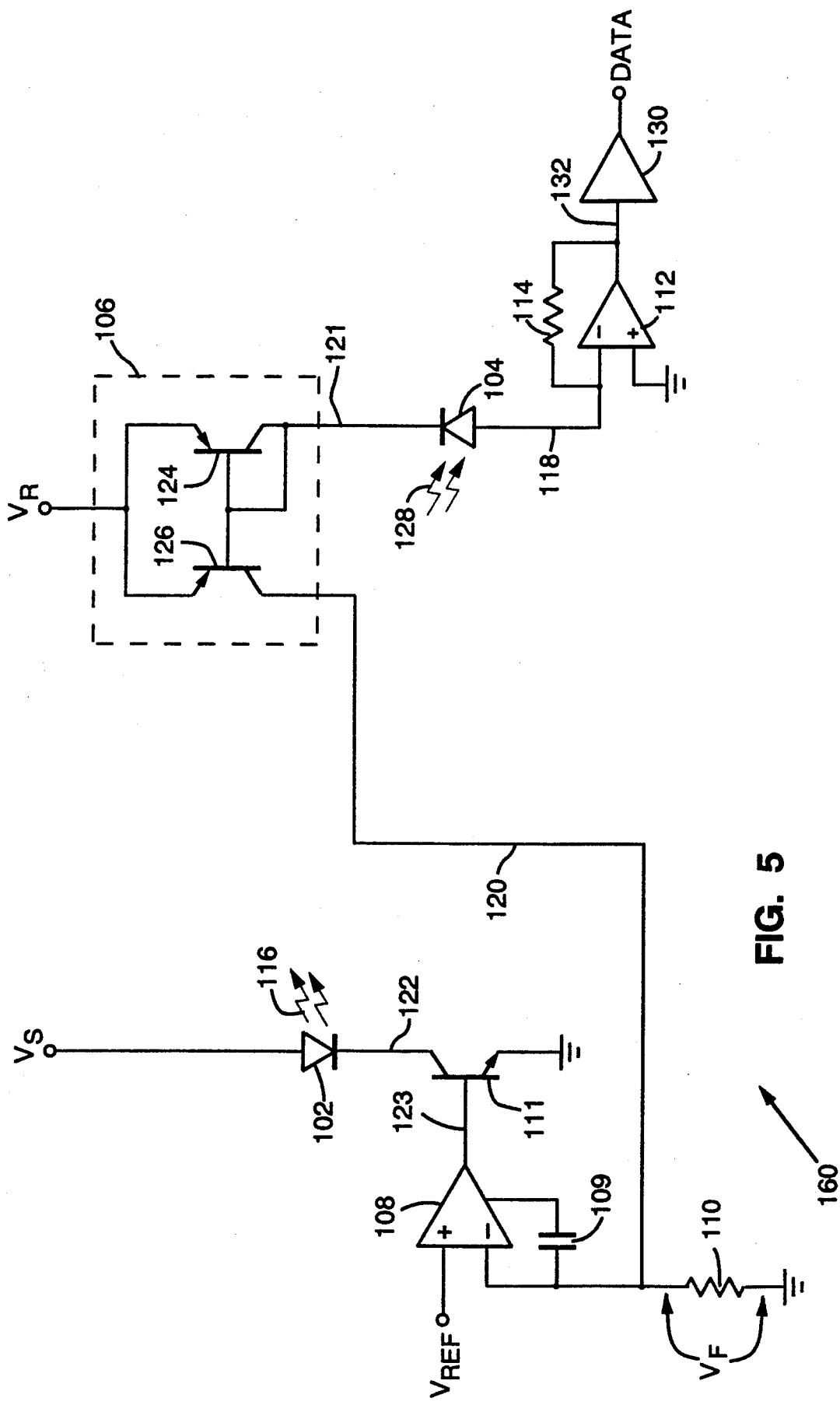
FIG. 5 illustrates in simplified, functional block diagram form another alternative preferred embodiment of the optical encoding system of the present invention.

FIG. 5 illustrates in simplified, functional block diagram form another alternative preferred embodiment 160 of the optical encoding system of the present invention. The basic components are unchanged from the configuration of FIG. 3, except for the deletion of a photodiode 105 and its buffer amplifier 113 with associated feedback resistor 115.

Circuit operation for the configuration of FIG. 5 is essentially identical to that described above for the configuration of FIG. 3. The only significant difference is with respect to the input current 121 of the current mirror 106. In FIG. 5, the input current 121 of the current mirror 106 and the current 118 through the photodiode 104 (and therefore the input current to the buffer amplifier 112) are one and the same.

It will be recognized that, unlike the configuration of FIG. 3, only a single photodiode 104 is used. Hence, it cannot be disposed in a phased orientation and no summing of currents occurs to produce a substantially constant input current 121 to the current mirror 106. Therefore, no canceling of current variations occurs and the input current 121 of the current mirror 106 is not substantially constant. Rather, since the input current 121 of the current mirror 106 is the current 118 through the photodiode 104, it is modulated by the received light 128. Thus, the modulation-induced variations in the input current 121 are duplicated in the output current 120 of the current mirror 106.

These duplicate modulation-induced variations in the output current 120 of the current mirror 106, i.e., the feedback current 120, produce a similarly modulated feedback voltage $V_F$. If this modulation effect passes through the error amplifier 108 (according to the description above for FIG. 3) the light 116 emitted by the LED 102 will also be modulated. Thus, in this configuration of FIG. 5 the error amplifier 108 should be compensated (as described above for FIG. 3) so as to filter out any undesirable modulation effects.

Among the advantages of the present invention are that (1) current mirrors occupy minimal die area within an integrated circuit chip, and (2) the circuit performance characteristics of the components making up current mirrors can quite easily be matched very precisely. As is known in the art, a current mirror is substantially self-regulative in that its proportional duplication, or "mirroring," of its input current to produce its output current is substantially independent of its intrinsic operating parameters (e.g. typically matched within 5%). Thus, the integrated circuit embodiment of the present invention can be significantly reduced in size and requires little post-fabrication adjustment.

It should be understood that various alternatives to the embodiments of the present invention described herein may be employed in practicing the present invention. It is intended that the following claims define the scope of the present invention and that structures and methods within the scope of these claims and their equivalents be covered thereby.

What is claimed is:

1. An apparatus for use in an optical encoder of the type in which a code disk having indicia formed thereon is positioned for rotation through an optical path, said indicia imparting intensity variations in light traveling along said optical path, said apparatus comprising:

light source means for providing light of adjustable intensity;

light reception means, positioned with respect to said light source means to define said optical path, for receiving light from said light source means, for providing a reception intensity signal current which is proportional to said received light intensity variations, and for providing an intensity level signal current which is proportional to the total of said received light;

data signal generation means responsive to said reception intensity signal current for converting said reception intensity signal current into a data signal;

self-regulative feedback means responsive to said intensity level signal current for generating an intensity control feedback signal current which is proportional to said intensity level signal current, wherein said self-regulative feedback means has intrinsic operating parameters and said proportionality of said signal currents is substantially independent thereof; and intensity adjustment means responsive to said intensity control feedback signal current for maintaining said intensity of said light source means at a predetermined level.

2. An apparatus as recited in claim 1, wherein said light source means comprises a light emitting diode.

3. An apparatus as recited in claim 1, wherein said light reception means comprises a plurality of photosensitive diodes, said reception intensity signal current comprises a plurality of electrical currents and said intensity level signal current comprises a sum of said plurality of electrical currents.

4. An apparatus as recited in claim 1, wherein said light reception means comprises a photosensitive diode, said reception intensity signal current comprises an electrical current and said intensity level signal current comprises said electrical current.

5. An apparatus as recited in claim 1, wherein said data signal generation means comprises a voltage comparator circuit.

6. An apparatus as recited in claim 1, wherein said data signal generation means comprises a differential amplifier circuit.

7. An apparatus as recited in claim 1, wherein said feedback means comprises a current mirror having an input coupled to receive said intensity level signal current and an output which provides said intensity control feedback signal current.

8. An apparatus as recited in claim 1, wherein said feedback means comprises a current mirror having an input coupled to current control means for ensuring that a substantially fixed input current flows through said input, said current mirror further having an output coupled to said light reception means which provides an output current substantially proportional to said fixed input current, and further wherein said intensity control feedback signal if the difference between said output current and said intensity level signal current.

9. An apparatus as recited in claim 8, wherein said current control means comprises a resistor.

10. An apparatus as recited in claim 7, 8 or 9, wherein said current mirror comprises a first transistor having a first emitter, a first collector and a first base, said first collector comprising said input to said current mirror, and further wherein said current mirror further comprises a second transistor having a second emitter, a second collector and a second base, said second collector comprising said output of said current mirror.

11. An apparatus as recited in claim 1, wherein said intensity adjustment means comprises a differential amplifier circuit whose output controls said intensity of said light source means.

12. An apparatus for use in an electronic optical encoding system comprising:

a bias control circuit having a first input, a second input and an output, said first input coupled to a reference voltage;

a photoemission device coupled to said output of said bias control circuit, wherein said photoemission device provides light having an intensity determined by said bias control circuit;

a current supply having first, second and third terminals, said first terminal for coupling to a power supply, said third terminal coupled to said second input of said bias control circuit, wherein current flowing out of said third terminal is substantially proportional to the current flowing out of said second terminal; and photosensitive means coupled to said second terminal of said current supply and positioned to receive light from said photoemission device for producing a current substantially proportional to the total intensity of said light received from said photoemission device.

13. An apparatus for use in an electronic optical encoding system comprising:

a bias control circuit having a first input, a second input and an output, said first input coupled to a reference voltage;

a photoemission device coupled to said output of said bias control circuit, wherein said photoemission device provides light having an intensity determined by said bias control circuit;

a current supply having first, second and third terminals, said first terminal for coupling to a power supply, said second terminal coupled to current control means for ensuring that a substantially fixed current flows from said second terminal, and said third terminal coupled to said second input of said bias control circuit, wherein current flowing out of said third terminal is substantially proportional to said fixed current flowing out of said second terminal; and photosensitive means coupled to said third terminal of said current supply and positioned to receive light from said photoemission device for producing a current ratio $I_1:I_2$ which is substantially proportional to the total intensity of said light received from said photoemission device, wherein said current flowing out of said third terminal divides into said first current $I_1$ flowing through said photosensitive means and said second current $I_2$ flowing to said bias control circuit.

14. An apparatus as recited in claim 12 or 13, wherein said bias control circuit comprises a differential amplifier circuit.

15. An apparatus as recited in claim 12 or 13, wherein said photoemission device comprises a light emitting diode.

16. An apparatus as recited in claim 12 or 13, wherein said current supply comprises a current mirror and said second and third terminals of said current supply comprise the input and output terminals, respectively, of said current supply.

17. An apparatus as recited in claim 13, wherein said current control means comprises a resistor.

18. An apparatus as recited in claim 12 or 13, Wherein said photosensitive means comprises a plurality of photodiodes and said first current $I_1$ comprises a sum of a plurality of electrical currents.

19. An apparatus as recited in claim 12 or 13, wherein said photosensitive means comprises a photodiode.

* * * * *